(12) United States Patent
Haynie

(10) Patent No.: US 10,886,418 B2
(45) Date of Patent: Jan. 5, 2021

(54) SPLIT-GATE JFET WITH FIELD PLATE

(71) Applicant: Texas Instruments Incorporated, Dallas, TX (US)

(72) Inventor: Sheldon Douglas Haynie, Morgan Hill, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/281,626

(22) Filed: Feb. 21, 2019

(65) Prior Publication Data

US 2020/0274002 A1 Aug. 27, 2020

(51) Int. Cl.
| | | |
|---|---|---|
| H01L 29/80 | (2006.01) |
| H01L 31/112 | (2006.01) |
| H01L 29/808 | (2006.01) |
| H01L 29/423 | (2006.01) |
| H01L 29/66 | (2006.01) |
| H01L 29/78 | (2006.01) |
| H01L 29/40 | (2006.01) |

(52) U.S. Cl.
CPC .......... *H01L 29/808* (2013.01); *H01L 29/402* (2013.01); *H01L 29/42316* (2013.01); *H01L 29/66681* (2013.01); *H01L 29/66893* (2013.01); *H01L 29/7817* (2013.01)

(58) Field of Classification Search
CPC ............. H01L 29/8083; H01L 29/0696; H01L 29/7802; H01L 29/808; H01L 29/1608; H01L 29/7832; H01L 29/66909; H01L 29/7816; H01L 29/66666; H01L 29/7827; H01L 29/66712; H01L 29/732; H01L 29/735; H01L 29/7817; H01L 29/1008; H01L 29/66893
USPC ........................................................ 257/262
See application file for complete search history.

(56) References Cited

U.S. PATENT DOCUMENTS

| | | | |
|---|---|---|---|
| 5,319,227 A | 6/1994 | Lapham et al. |
| 2006/0261408 A1* | 11/2006 | Khemka | H01L 29/7835 257/335 |
| 2013/0119465 A1* | 5/2013 | Mallikarjunaswamy | H01L 21/823412 257/334 |

* cited by examiner

*Primary Examiner* — Theresa T Doan
(74) *Attorney, Agent, or Firm* — Andrew R. Ralston; Charles A. Brill; Frank D. Cimino

(57) ABSTRACT

An IC with a split-gate transistor includes a substrate doped the second conductivity type having a semiconductor surface layer doped the first conductivity type. The transistor includes a first doped region formed as an annulus, a second doped region including under the first doped region, and a third doped region under the second doped region, all coupled together and doped the second conductivity type. A fourth doped region doped the first conductivity type is above the third doped region. A fifth doped region doped the first conductivity type is outside the annulus. Sixth doped regions doped the first conductivity type include a first sixth doped region surrounded by the annulus in the semiconductor surface layer and a second sixth doped region in the fifth doped region. Field oxide includes a field oxide portion between the fifth and the first doped region. A field plate is on the field oxide portion.

20 Claims, 11 Drawing Sheets

US 10,886,418 B2

SPLIT-GATE JFET WITH FIELD PLATE

FIELD

This Disclosure relates to the field of semiconductor devices, and more particularly, but not exclusively, to junction field effect transistors (JFETs) that may be formed on integrated circuits (ICs).

BACKGROUND

JFETs are suitable for some circuit designs because their high input impedance results in low current being drawn from the device supplying the input signal, and also because JFETs may provide relatively low noise. Thus a JFET is frequently employed as a normally ON device at the input stage of high-performance amplifiers, or to provide a low current (e.g., 1 nA) as a saturating startup or a bleed device, or to prevent a node from being "stuck" for more reliable startup behavior in high voltage (e.g., 100 V rated) circuits using laterally diffused metal oxide semiconductor (LDMOS) devices. LDMOS comprising circuits may be used in applications such as for a power supply controller, field effect transistor (FET) driver, power over Ethernet, and other similar circuits.

A JFET includes at least three active terminals, comprising a gate of one doping type, and a source and a drain of the other doping type. The source contact is generally separated from the drain by the gate. When a potential difference of the proper polarity is applied between the gate and source, the JFET will become more resistive to current flow, which means less current will flow in the channel between the source and drain terminals when a given potential difference is applied between the source and the drain. Four terminal JFETs are also known which include two gates, with a top gate and a bottom gate, typically where the two gates can both be driven together, or driven by separate signals including one of the gates being tied to a fixed potential and the other gate driven by a signal.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure describes JEFTs that can be fabricated from bipolar complementary metal oxide semiconductor (BiCMOS)/LDMOS process steps. An example of a FET having a field plate is a double diffused (or drain extended) metal oxide semiconductor (DMOS) device, such as an LDMOS device, where the field-plated FET can be an n-channel device or a p-channel device, which can be used for power or signal level modulation.

Disclosed aspects in one example include an IC with a split-gate transistor (e.g., a JFET) that includes a semiconductor surface layer doped a first conductivity type located over a substrate doped a second conductivity type. The transistor includes a top gate implemented by a first doped region (e.g., a high voltage pwell (HPWELL)) that may be optionally formed as an annulus, a second doped region (e.g., a p-drift region (PDRIFT region), and a third doped region (e.g., a p-type reduced surface field (PRSF) layer as a back gate) under the second doped region, all coupled together and doped the second conductivity type.

A fourth doped region doped the first conductivity type (e.g., an n-drift (NDRIFT) region) is located above the third doped region. A fifth doped region doped the first conductivity type (e.g., a high voltage nwell (HNWELL)) is outside the annulus (if present). Sixth doped regions doped the first conductivity type include a first sixth doped region surrounded by the annulus in the semiconductor surface layer (e.g., a source) and a second sixth doped region in the fifth doped region (e.g., a drain contact). Field oxide includes a field oxide portion positioned between the fifth and the first doped region. A field plate (e.g., comprising polysilicon) is on the field oxide portion.

BRIEF DESCRIPTION OF THE DRAWINGS

Reference will now be made to the accompanying drawings, which are not necessarily drawn to scale, wherein:

FIG. 1A shows a cross-sectional view of the in-process IC after forming n-buried layer (NBL) regions in an n-epitaxial (n-epi) layer over a p-substrate.

FIG. 1B shows a cross-sectional view of the in-process IC after forming PDRIFT regions for the NJFET device and for the NLDMOS device.

FIG. 1C shows a cross-sectional view of the in-process IC after forming HPWELL regions including an HPWELL region that forms a top gate of the NJFET, a PRSF layer that forms a back gate for the NJFET, as well as an NDRIFT region that may respond to a modulation between the HPWELL region and the PRSF layer in the lateral direction for the NJFET device, as well as a drift region positioned between what will be a drain and a source for the NLDMOS device.

FIG. 1D shows a cross-sectional view of the in-process IC after forming a doped region that is doped the first conductivity type shown as an HNWELL in the semiconductor surface layer for the NJFET.

FIG. 1E shows a cross-sectional view of the in-process IC after forming heavily doped regions (e.g., a source/drain implant) within the HNWELL for the drain and for forming the source for the JFET device, and the source and drain regions for the NLDMOS device.

FIG. IF shows a cross-sectional view of the in-process IC after forming a patterned polysilicon layer that provides a gate electrode for the LDMOS device and a field plate for the NJFET device positioned adjacent the top gate (HPWELL) over the shallow trench isolation (STI) of the NJFET device. The formation of the gate electrode and the field plate follows a gate oxidation that forms a gate dielectric layer under the gate electrode.

Figure 1A:
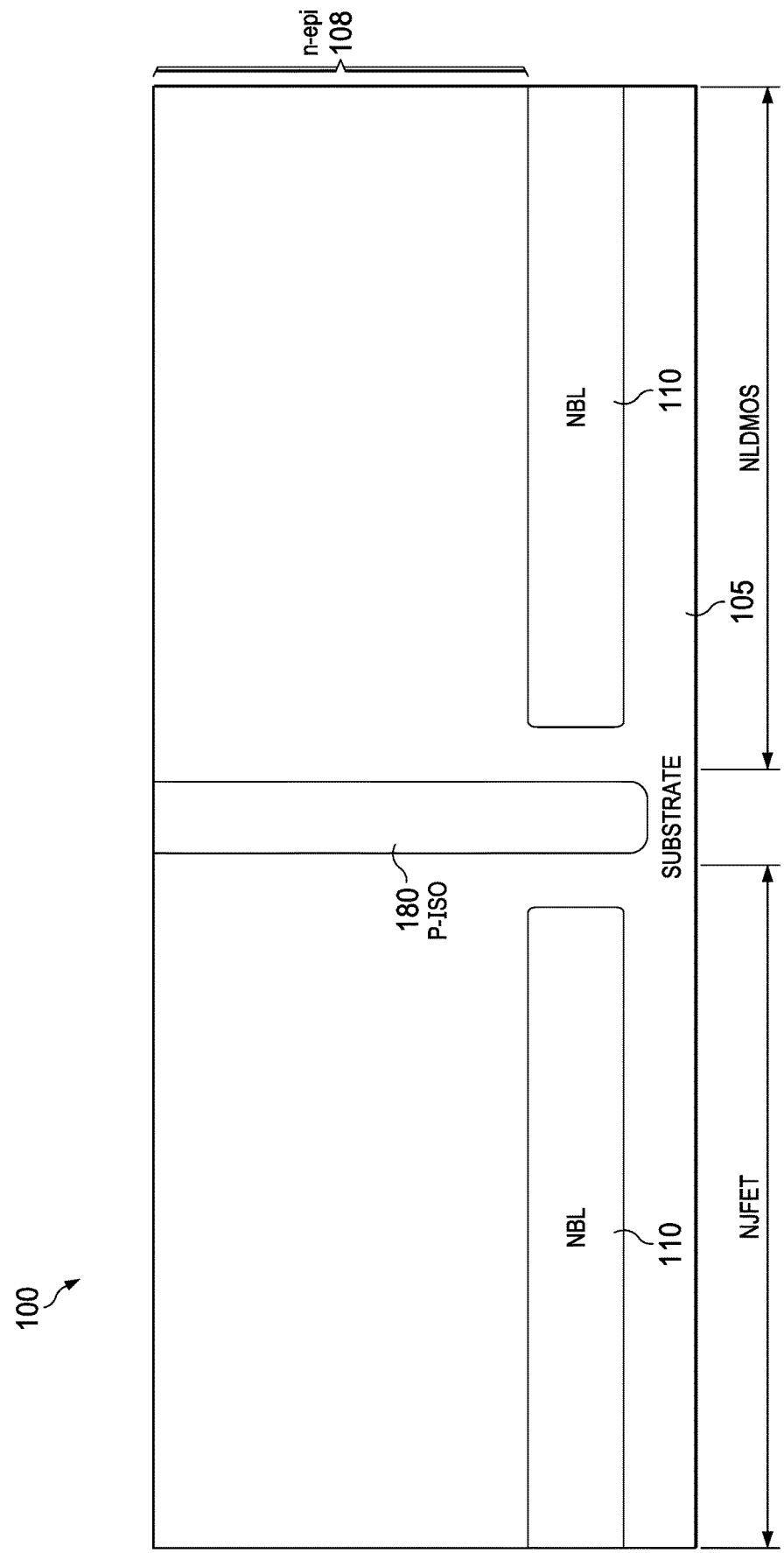
FIGS. 1A-1G shows successive half-device cross-sectional device views corresponding to an example method of forming an IC including a split-gate NJFET and NLDMOS device using process steps compatible with BiCMOS/NLDMOS technology.
Figure 1B:
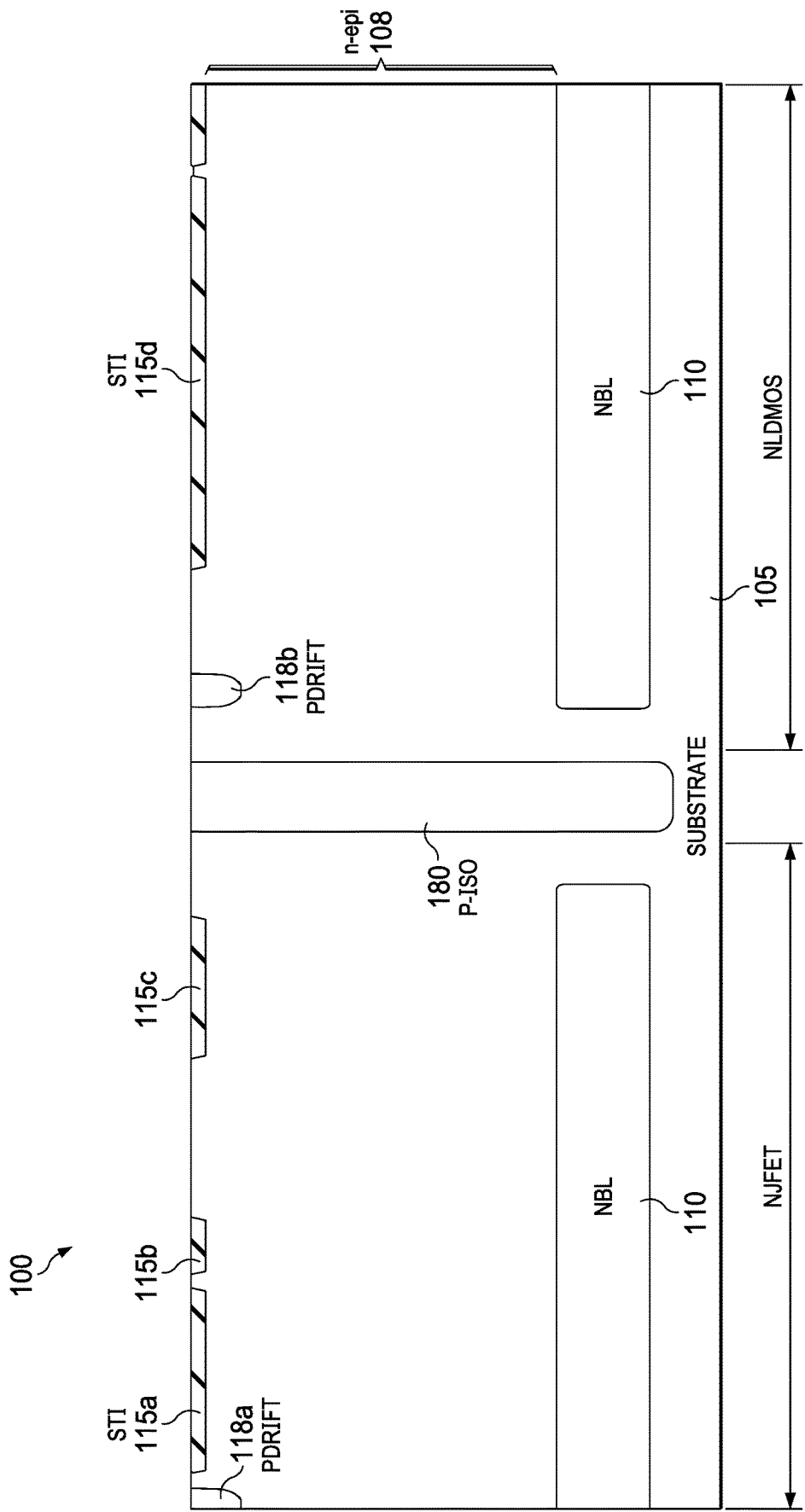
Figure 1C:
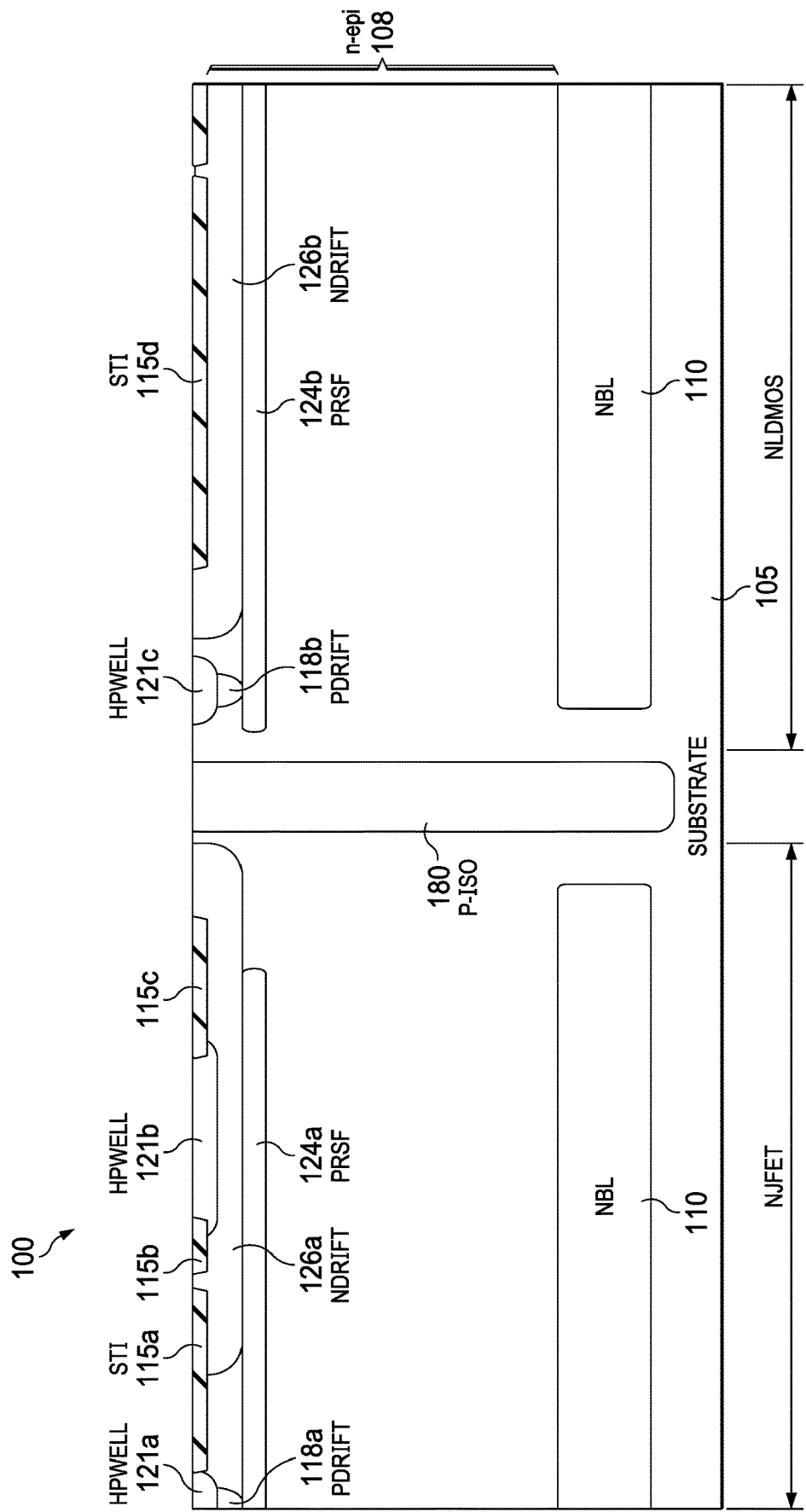
Figure 1D:
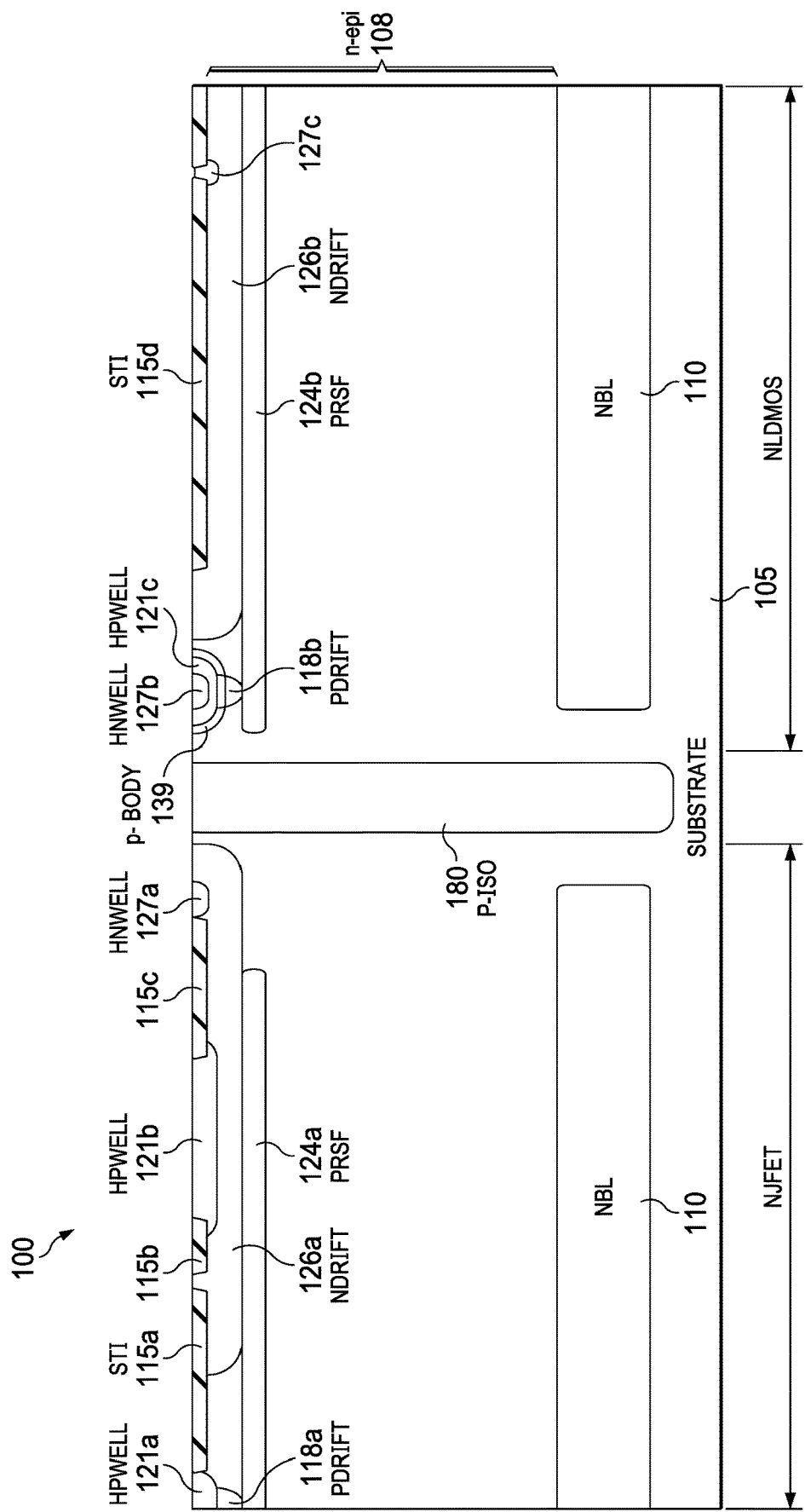
Figure 1E:
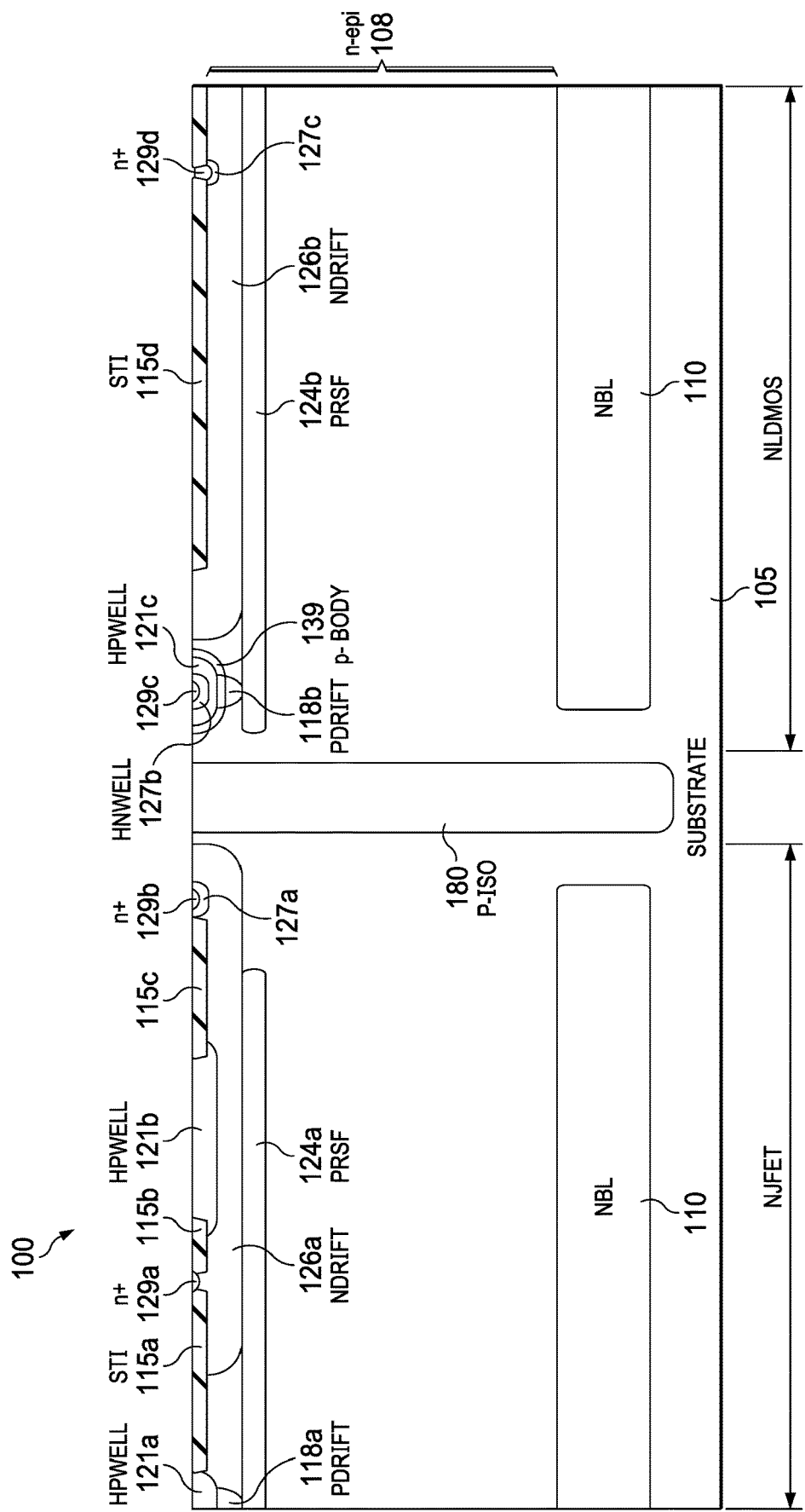
Figure 1F:
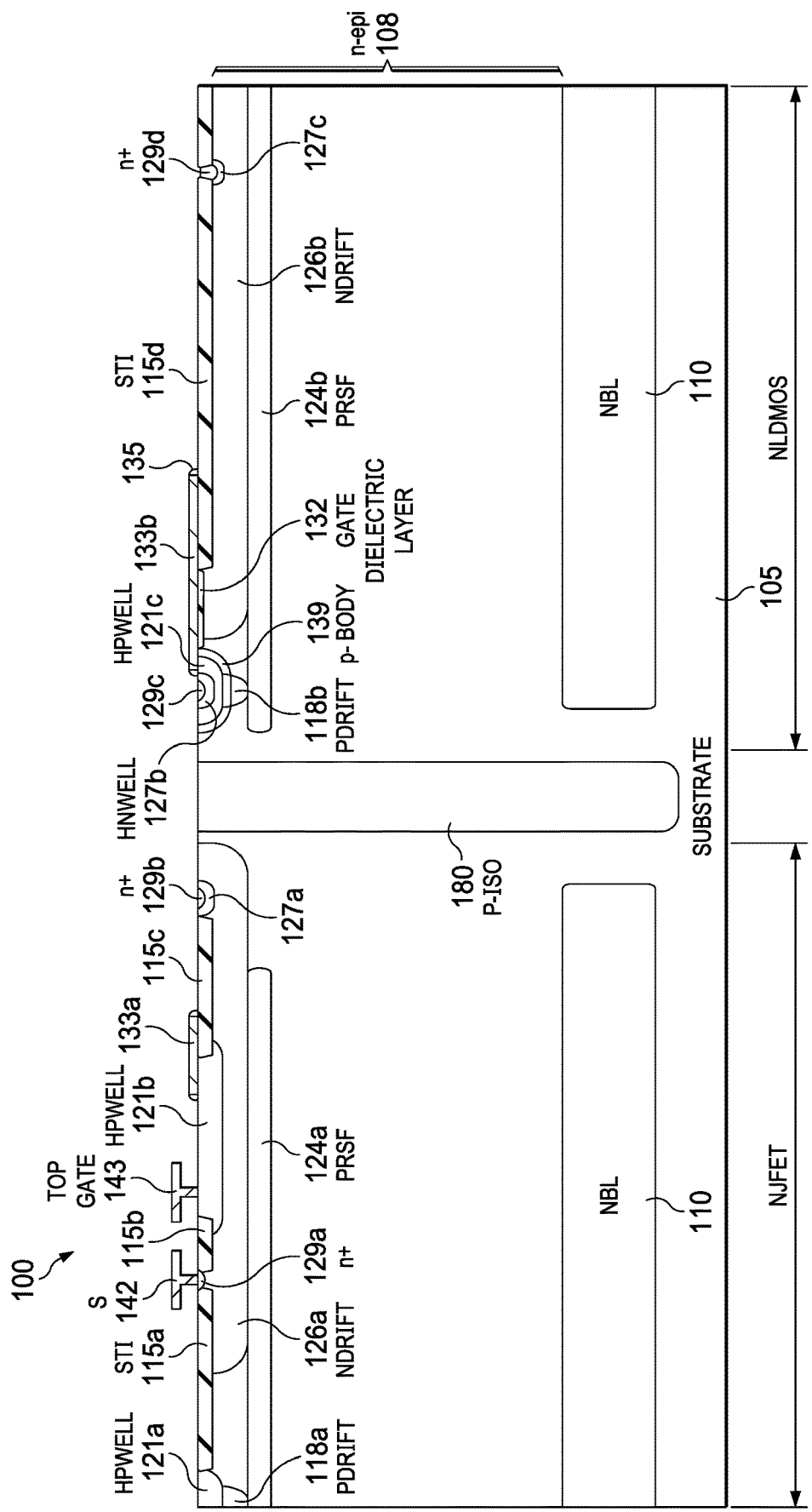
Figure 1G:
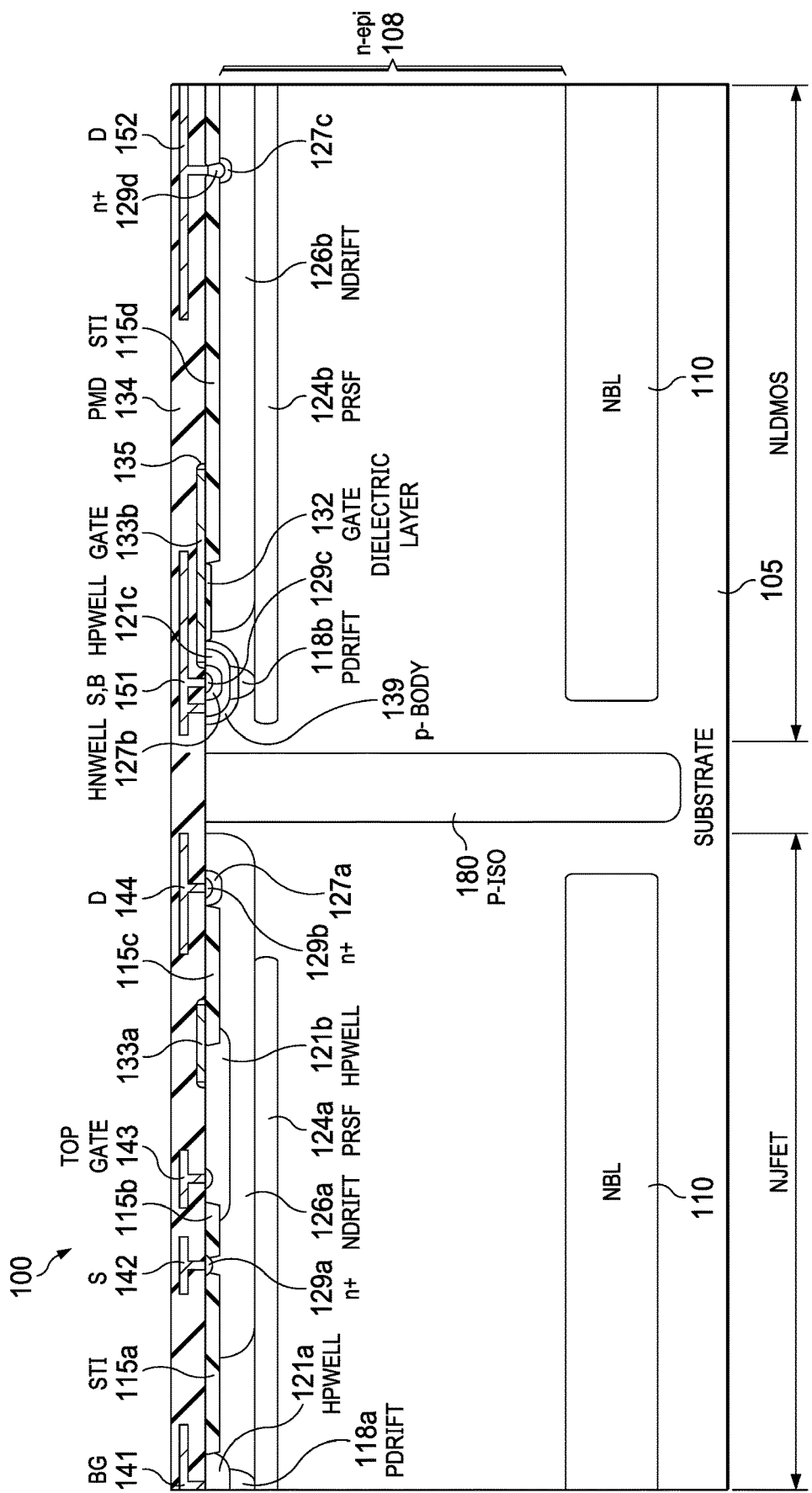

FIG. 1G shows a cross-sectional view of the in-process IC after depositing a pre-metal dielectric (PMD) layer, then performing a contact etch that forms contact openings through the PMD layer for the respective terminals of both the NJFET and NLDMOS devices. The contact etch is followed by a metal layer deposition and patterning to form metal contacts to provide for the NJFET backgate (BG) metal over the HPWELL, source (S) metal to an n+ contact to the NDRIFT region, top gate metal to the HPWELL, and drain (D) metal to an n+ contact to the HNWELL that is located within the NDRIFT region.

Figure 2A:
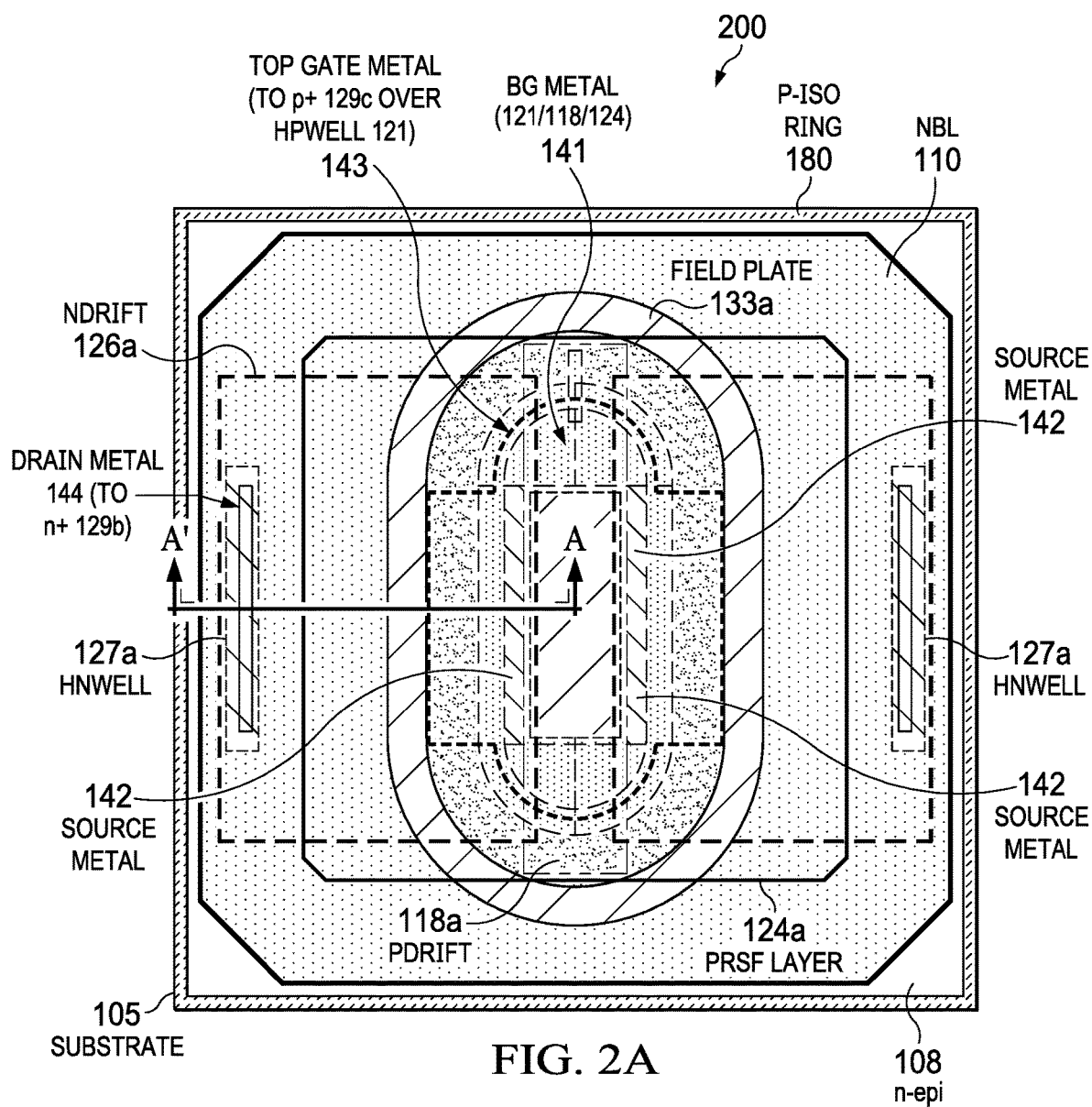

FIG. 2A is a top view of a disclosed split-gate NJFET device showing its metal contacts including drain contact, source contact, BG contact, and top gate contact, according to an example aspect. A cutline A-A' is shown through the device and is referred to in the following FIGs.

Figure 2B:
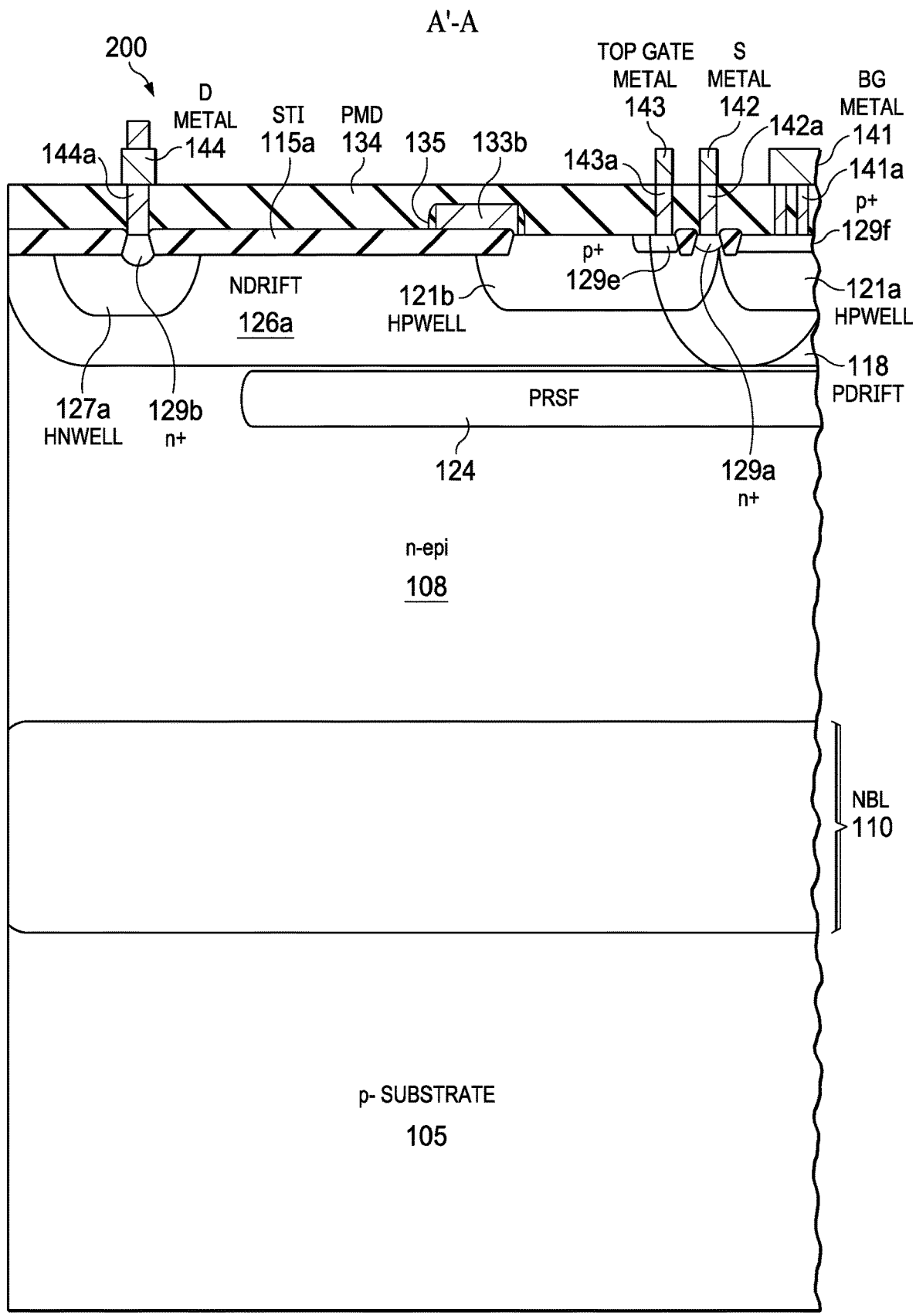

FIG. 2B is a cross sectional view of the split-gate JFET device shown in FIG. 2A along the cutline A-A'. This view shows from the left drain contact over an n+ contact in an HNWELL, top gate contact to a p+ contact in a HPWELL, and source contact to an n+ contact to the NDRIFT region, and BG contact to the PRSF layer (the back gate).

Figure 3:
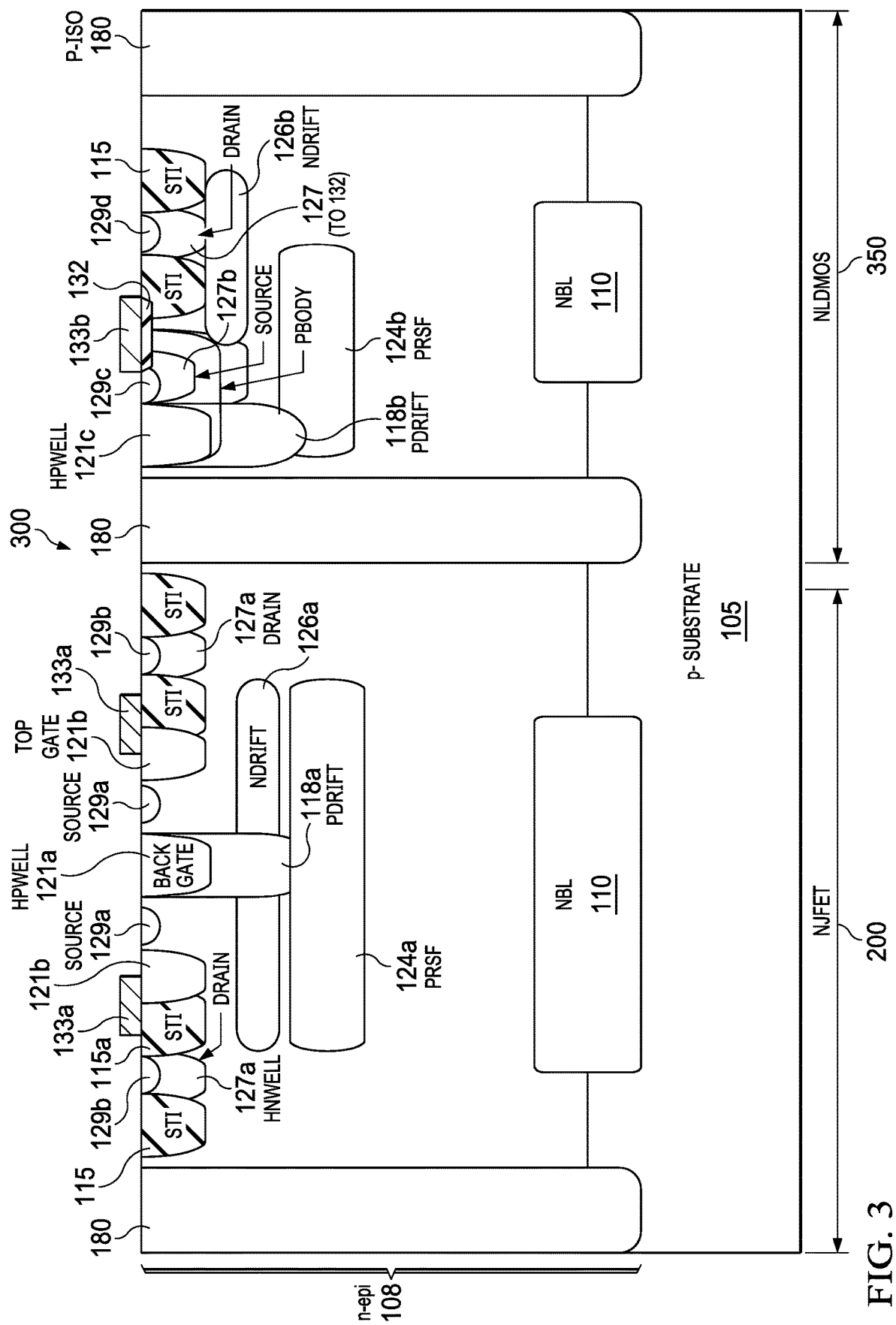

FIG. 3 shows a cross sectional view of an IC including a disclosed split-gate JFET at a scale that shows schematically the full width of the device of FIGS. 2A and 2B but now a full device together with an NLDMOS device formed in the same n-epi layer on the same substrate, also showing an outer isolation ring around the NJFET device and around the LDMOS device.

Figure 4A:
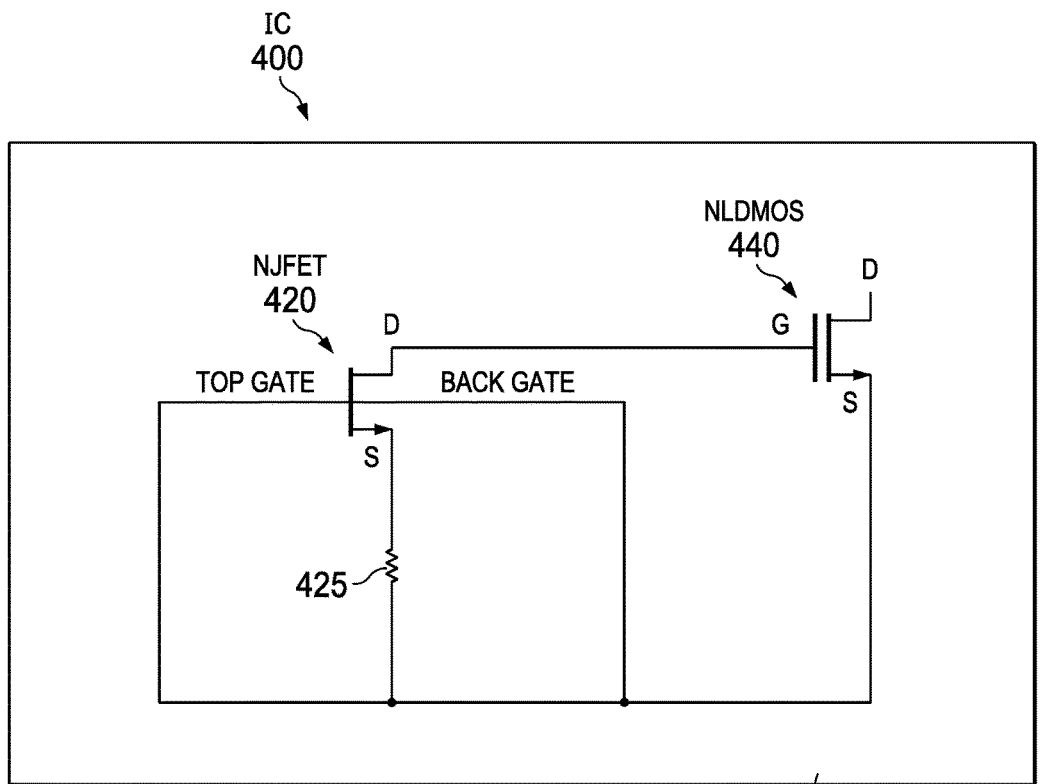

FIG. 4A shows an example IC having a disclosed split-gate NJFET in a start-up circuit having its drain coupled to the gate of an NLDMOS device which is part of other circuitry that can be part of a power management circuit, amplifier or other high voltage tolerant circuit that would use NLDMOS devices. The JFET is shown having its top gate and back gate connected together.

Figure 4B:
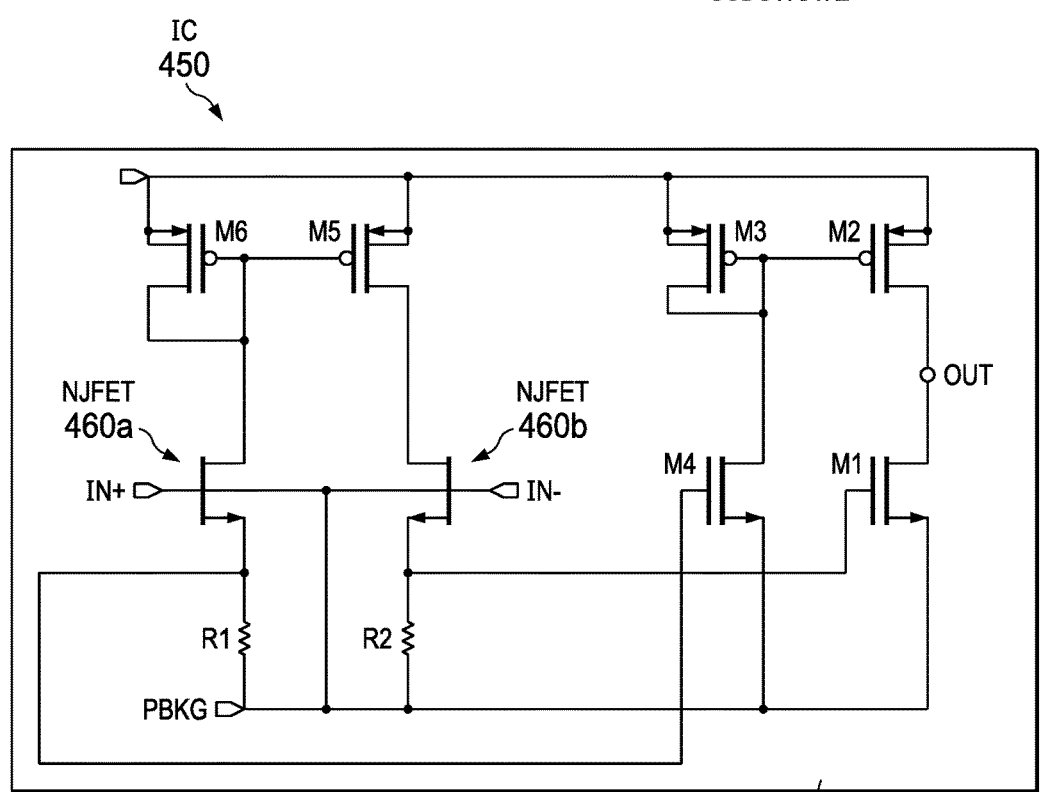

FIG. 4B shows another example IC shown as an amplifier that comprises a NJFET input differential pair which is configured in a source follower configuration to reduce the bias current and noise that could be present conventionally from either a bipolar or MOSFET-based input differential pair.

DETAILED DESCRIPTION

Example aspects in this Disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Application discloses various methods and devices that may be beneficially applied to manufacturing ICs including one or more JFETs. While such methods and devices may be expected to provide benefit of simplified manufacturing and/or improved performance or improvements in reliability of such devices, no particular result is a requirement of the described invention(s) unless explicitly recited in a particular claim.

Disclosed aspects can provide a split-gate NJFET device using process steps compatible with or consistent with process steps that may be used to form a BiCMOS with DMOS device. For example, a doped region that may operate as a NDRIFT region of a BiCMOS device may be used as a channel region of the NJFET, and an HPWELL of the BiCMOS device may be used as a top gate of the NJFET.

In some cases, the NJFET has an annular HPWELL top gate that pinches the n-channel and achieves the desired JFET device voltage rating and specification. In the FIGs. described below, for the NJFET the back gate is provided by a PRSF layer, and the top gate is a HPWELL that may optionally be shaped as an annulus. Some illustrated examples describe the source being located within, e.g. surrounded by, the annulus, and the drain being outside the annulus such that the HPWELL is located between the source and the drain. Although generally described for NLDMOS and NJFET devices, disclosed aspects can also be used for form ICs having PLDMOS and PJFET devices as known in the art by switching the respective dopant types and some minor dopant level changes.

FIGS. 1A-1G show successive half-device cross-sectional device views corresponding to an example method of forming an IC including a split-gate NJFET and NLDMOS transistor. The NJFET is shown adjacent the NLDMOS transistor to illustrate similar process steps used to form both devices while producing different device architectures. Various example devices within the scope of the disclosure may or may not include a BiCMOS/NLDMOS transistor. Without implied limitation such process steps are described including BiCMOS/NLDMOS process steps. It is recognized herein that JFET devices with a split-gate may reduce sources of electrical noise by use of majority carriers, a subsurface channel, and a reduced area/perimeter top gate that reduces the input capacitance and loading. Disclosed JFET devices may be formed using only existing LDMOS and CMOS junctions provided in a BiCMOS with DMOS process with no additional steps or other processing costs. Disclosed NJFET devices generally support operation at greater than 100 V (drain to source) and can provide a 90% (20 db) reduction in noise power vs. a conventional JFET design.

The high voltage capability may be realized by using the RESURF principal to form a depletion region in the extended drain of the JFET device in a manner similar to that of an NLDMOS device. This leads to a potentially asymmetric design where the drain-to-gate spacing is larger than the drain-to-source spacing if the source-to-gate voltage is not needed to be of equal value, or a symmetric device where the source-to-gate and gate-to-drain spacing and construction are comparable. Lower noise operation is obtained by disclosed JFETs by separating the top gate from the back gate (split-gate), such that a significantly smaller area is driven with the signal, and thus less noise is generated by some semiconductor device phenomena which are proportional to the area and perimeter as compared to a conventional single gate JFET where the entire gate-to-source junction is susceptible to noise generation.

FIG. 1A shows a cross-sectional view of an in-process IC 100 after forming an NBL 110 near an interface between a p-substrate 105 and an n-epi layer 108. A p-isolation (P-ISO) region 180 is also shown providing junction isolation between devices by extending from the top surface of the n-epi layer 108 to the p-substrate 105. The P-ISO region 180 may be formed from upward diffusion before forming the NBL 110, or can be formed after forming the NBL 110 by conventional downward diffusion. The doping level in the n-epi layer 108 can be about $1\times10^{15}$ cm$^{-3}$. A masking level may be performed before or after forming the n-epi layer 108 to selectively block at least one NBL implant to provide discrete NBL 110 regions. The NBL 110 may also include epitaxial layer(s). The NJFET device is shown to be identical to the NLDMOS device at this point in the process flow.

FIG. 1B shows a cross-sectional view of the in-process IC 100 after forming PDRIFT regions 118a and 118b respectively for the NJFET device and for the NLDMOS device, e.g. by a masked implant. The PDRIFT region implant can comprise $^{11}$B with a dose of about $1 \times 10^{12}$ cm$^{-2}$ with three or more implant energy steps of about 50 keV to about 1.6 MeV as a chained implant. As used herein throughout, "about" refers to ±5%. The doping level in the PDRIFT regions 118a, b may be about $1 \times 10^{16}$ cm$^{-3}$. The PDRIFT regions 118a, b can be formed before forming one or more HPWELLs as described below, where the PDRIFT regions 118a, 118b provide connections respective HPWELLs at the surface of the NJFET device to a PRSF layer which is an embedded layer as also described below. FIG. 1B also shows field oxide as STI 115a, 115b, 115c and 115d, which can alternately be implemented as a local oxidation of silicon (LOCOS) oxide.

FIG. 1C shows a cross-sectional view of the in-process IC 100 after forming a HPWELLs 121a, 121b, 121c, PRSF layers 124a, 124b, and NDRIFT layers 126a, 126b. The HPWELL 121b forms the top gate for the NJFET device, which as mentioned above may be shaped as an annulus. The HPWELL 121a and the PDRIFT region 118a provide a connection from the substrate top surface (n-epi 108) to the PRSF layer 124a that may operate as the back gate for the NJFET device. The NDRIFT region 126a may operate as the channel of the NJFET device. The HPWELL 121a and the PRSF layer 124a may modulate the resistance of the NDRIFT region 126a in the lateral direction for the NJFET device as well as the NDRIFT region 126b between what will be the drain and source for the NLDMOS device.

The forming of the HPWELLs 121a, 121b, 121c, PRSF layers 124a, 124b, and NDRIFT regions 126a, 126b all generally involve masked ion implants, which are not limited to any particular order. The HPWELL implant can comprise $^{11}$B multiple stepped energy chain of three or more implants in the 10 keV to 500 keV range with a total dose of about $2 \times 10^{12}$ cm$^{-2}$ to about $1 \times 10^{13}$ cm$^{-2}$. The implant for forming the NDRIFT regions 126a, 126b can comprise $^{31}$P at a dose of about $1 \times 10^{12}$ cm$^{-2}$ with a chain of multiple energy steps each in a range between about 50 keV to about 1 MeV. The doping level in the PRSF layers 124a, 124b is generally about $1 \times 10^{19}$ cm$^{-3}$, thus being relatively heavily doped, while the doping level in the NDRIFT regions 126a, 126b is generally about $1 \times 10^{16}$ cm$^{-3}$.

FIG. 1D shows a cross-sectional view of the in-process IC 100 after forming another doped region shown as an HNWELL 127a in the n-epi layer 108 for the NJFET, and HNWELLs 127b and 127c for the LDMOS device in respective regions to be the drain and the source. The implant species for forming the HNWELLs 127a, b, c may be phosphorous, implanted with multiple energy steps each in a range between about 10 keV and about 1 MeV with a total dose in the range of about $1 \times 10^{12}$ cm$^{-2}$ to about $1 \times 10^{13}$ cm$^{-2}$. A p-body region 139 shown may be formed for only the LDMOS device which will provide the channel region under the gate for the LDMOS device.

FIG. 1E shows a cross-sectional view of the in-process IC 100 after forming heavily doped regions 129 doped the first conductivity type, in this example n-type, including an n+ doped region 129a within the NDRIFT region 126a, an n+ doped region 129b within the HNWELL 127a for the drain region of the JFET device, and n+ doped regions 129c and 129d for respectively forming source and drain regions for the NLDMOS device. This step is generally called an n+ source/drain (S/D) implant. The n+ S/D implant can be a combination of arsenic and phosphorous with a total dose within a range from about $1 \times 10^{15}$ cm$^{-2}$ to about $1 \times 10^{16}$ cm$^{-2}$ implanted with multiple energy steps each in a range between about 10 keV and about 100 keV. A p+ S/D implant generally follows that provides p+ contacts (not shown) for the HPWELL 121, p-body 139, and the p-substrate 105. The p+ S/D implant can be boron with a total dose in a range between about $1 \times 10^{15}$ cm$^{-2}$ and about $1 \times 10^{16}$ cm$^{-2}$ chain implanted with multiple energy steps each in a range between about 10 keV and about 100 keV.

FIG. 1F shows a cross-sectional view of the in-process IC 100 after forming a patterned polysilicon layer that is generally formed before the n+ and p+ S/D implants. The patterned layer provides a field plate 133a that partially overlaps the HPWELL 121b and the STI 115c of the NJFET device, and provides a gate electrode 133b for the LDMOS device. The polysilicon layer may be formed after a gate oxidation which forms a gate dielectric layer 132 between the gate electrode 133b and the NDRIFT region 126b, and between the field plate 133a and the HPWELL 121b (not shown). In some examples the field plate 133a is formed in an annular shape that encircles the HPWELL 121b. The gate dielectric layer 132 may comprise a gate oxide layer that is typically 12 nm to 14 nm thick, but may be thinner than 10 nm for lower threshold voltage devices.

The gate electrode 133b and field plate 133a may be formed from a polysilicon layer 180 nm to 320 nm thick, and may be doped n-type or p-type, for example doped n+ by the associated n+ S/D implant that forms the n+ sources and drains, or more lightly doped to tune the work function for the LDMOS gate. Sidewall spacers 135 (e.g., silicon oxide and/or silicon nitride) are shown for the gate electrode 133b and for the field plate 133a, where the spacers 135 provide for optional self-aligned silicide (salicide) processing.

FIG. 1G shows a cross-sectional view of the in-process IC 100 after depositing a PMD layer 134, such as a tetraethoxysilane (TEOS) or High Density Plasma (HDP)-derived silicon oxide layer, and a contact etch to etch contact holes through the PMD layer 134 for the respective terminals of both the NJFET and NLDMOS devices. The contact etch is followed by a metal deposition and patterning to form metal contacts. The metal contacts include a BG terminal 141 to a p+ contact (not shown) over the HPWELL 121a, (coupled to the PRSF layer 124a through the PDRIFT region 118a), a source terminal 142 to the n+ doped region (source) 129a (coupled to the HPWELL 121b), a top gate terminal 143 to an unreferenced p+ contact to the HPWELL 121b, and a drain terminal 144 to the HNWELL 127a through the n+ contact 129b. A contact to the field plate 133a may be made outside the plane of the figure.

Metal contacts formed for the NLDMOS device include source and body (S, B) contact 151 that shorts the n+ doped region (source) 129c to the p-body region 139, the p-stack being similar to the gate of the NJFET (except the LDMOS device includes p-body region 139). The p-body region 139 acts as the p+ contact to the HPWELL 121c and also as the p-body 139 to the PDRIFT region 118b, which is connected to the PRSF layer 124b. A drain contact (D) 152 is also formed that connects to an n+ region 129d that is over an HNWELL 127c, which in turn is located over an NDRIFT region 126b.

FIG. 2A is a top view of a disclosed split-gate NJFET device 200 shown without implied limitation to the illustrated configuration. Feature indexes refer to like indexes in FIGS. 1A-1G for continuity, without implied limitation. The drain terminal 144 contacts an n+ region over the HNWELL 127a, the source terminal 142 contacts an n+ region, the BG terminal 141 contacts to a p+ contact over the HPWELL 121a over the PRSF layer 124a, and the top gate terminal 143 contacts a p+ region over the HPWELL 121a. As described above, the BG terminal 141 contacts a p+ region (which may be formed by a p+ diffusion of a CMOS process used for p-body contact in an NLDMOS device) to the HPWELL 121a over the PDRIFT region 118a to reach the PRSF layer 124a. The outer P-ISO region 180, which encircles the NJFET device 200 and extends from the top surface of n-epi layer 108 to the substrate 105, may help reduce junction leakage between adjacent regions of the n-epi layer 108. Optionally (not shown) the top gate terminal 143 may be shorted to the BG terminal 141. A cutline A'-A is shown along one-half of a width of the NJFET device 200 from the center of the BG to the drain for reference in FIG. 2B.

FIG. 2B is a cross sectional view of the split-gate NJFET device 200 shown in FIG. 2A along the cutline A'-A. Note that this view reverses the order of features as shown in FIGS. 1A-1G. This view shows from the left drain terminal 144 through a filled contact 144a (e.g., tungsten filled) through the PMD layer 134 to the n+ doped region 129b in the HNWELL 127a. The top gate terminal 143 connects via a filled contact 143a through the PMD layer 134 to a p+ contact 129e to the HPWELL 121b. The source terminal 142 connects via a filled contact 142a through the PMD layer 134 to an n+ doped region (source) 129a coupled to the NDRIFT region 126a.

The BG terminal 141 connects via filled contacts 141a through the PMD layer 134 to a p+ contact 129f to the HPWELL 121a. The BG terminal 141 is seen to be in the center of the NJFET device 200 (see FIG. 2A). In order from the center (at "A") toward the outside of the device (at "A'") is the source terminal 142, then the top gate terminal 143, then the drain terminal 144. In the illustrated example the HPWELL 121a forms an annulus and the PRSF layer 124a (providing the BG for the NJFET) is under the NDRIFT region 126a connected through the p+ contact 129e to the HPWELL 121a, coupled by the PDRIFT region 118a to the PRSF layer 124a.

FIG. 3 shows a cross sectional view of an IC 300 including a disclosed split-gate JFET being a representation of the split-gate NJFET device 200 shown in FIG. 2A and FIG. 2B, but now showing the complete device. For clarity, all STI regions for the IC 300 are now shown as 115 except for STI region 115c. An NLDMOS device 350 is shown for reference, formed in the same n-epi layer 108 on the same substrate 105, also showing an outer P-ISO ring 180 that isolates the NLDMOS device 350 from the NJFET device 200 and other devices on the same substrate. The field plate 133a (e.g., comprising polysilicon) of the NJFET device 200 is shown as two sections of an annular ring and is located partially over the field oxide region identified as STI 115c and partially over the HPWELL 121b. While the HNWELL 127a is shown associated with the drain of the IC 300, there is generally no HNWELL for the source of the NJFET device 200 because such an nwell may otherwise reduce the junction breakdown voltage from the source to the BG (e.g. the PRSF layer 124a). Where used, topside p+ contacts to the substrate 105 may be implemented by the doping process used to form the P-ISO region 180.

FIG. 4A shown as example IC 400 formed on a substrate 105 having a disclosed split-gate NJFET 420 implemented as described herein in a start-up circuit having its drain coupled to the gate of an NLDMOS device 440 that is part of other circuitry that can be power management, amplifier or other circuits that would use NLDMOS devices. Although not shown because FIG. 4A is a circuit schematic, as described above, there is generally an n-epi layer 108 on the substrate 105. The NJFET 420 is shown having its top gate and back gate connected together. In this arrangement, the start-up circuit provides more robust Electrostatic Discharge (ESD) and hot swap performance, by providing a nominal path to ground in parallel to the NLDMOS device's 440 gate to source. The NJFET 420 may also be used in an amplifier, level shifter or other analog circuit where low noise and high voltage gain are desired.

Regarding the IC 400 shown in FIG. 4A, the four terminals of the NJFET device 420 being fabricated only from elements of the NLDMOS device 440 will tend to track the NLDMOS device 440 for its drain to source breakdown voltage (Bvdss), and the Idss for the NJFET device 420 will tend to track the drain to source resistance (Rds) of the NLDMOS device 440. For IC 400, the NLDMOS device 440 will fluctuate in voltage with the IC fabrication processing due primarily to changes in received ion implant parameters such as the dose, and the doping level and thickness of the epitaxial layer. The NJFET device 420 uses the NDRIFT region of the NLDMOS device 440 for its NDRIFT region shown above as NDRIFT region 126b and thus will track its breakdown, and the on-state IDSs for the NJFET will also track the resistivity of the NDRIFT region and thus be related to (e.g., at least partially proportional) to the Bvdss of the NLDMOS device 440.

FIG. 4B shows another example IC 450 shown as an amplifier that is configured in a source follower configuration. The IC 450 comprises a NJFET input differential pair shown as 460a and 460b implemented as described herein to reduce the bias current and noise that may otherwise be present from conventional bipolar or MOSFET input differential pair. A differential signal (In+ and In−) is shown applied to the NJFET's 460a, 460b top gates. The signal is used to modulate a differential signal of the channel currents that is supplied from a PMOS current mirror shown as mirror connected PMOS transistors M6 and M5. The IC 450 develops a difference in the gate bias of the NMOS transistor shown as M1 that can comprise an NLDMOS transistor which together with a PMOS transistor shown as M2 provides an output stage that provides the output node for the IC 450. M2 is mirror connected with a PMOS transistor shown as M3. The IC 450 develops a difference in the gate bias of the M1 output vs the current from the NMOS bias device shown as M4 that can also be an LDMOS device. Resistors shown as R1 and R2 (e.g., 1 kohm each) provide negative feedback to improve linearity in the source follower configuration.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC), comprising:
   a substrate doped a second conductivity type having a semiconductor surface layer doped a first conductivity type;
   a split-gate transistor formed in or over the semiconductor surface layer and comprising:
      a first doped region formed as an annulus at a top surface of the semiconductor surface layer, and a second doped region under the first doped region, both conductively coupled together and doped the second conductivity type;
      a third doped region doped the first conductivity type in the semiconductor surface layer above the second doped region;
      a fourth doped region doped the first conductivity type outside the annulus in the third doped region; and
      fifth doped regions doped the first conductivity type including a first fifth doped region surrounded by the annulus in the third doped region, and a second fifth doped region in the fourth doped region;
   field oxide including a field oxide portion between the fourth doped region and the first doped region, and
   a field plate on the field oxide portion.

2. The IC of claim 1, wherein the field plate comprises polysilicon, is annular-shaped, and is at least partially outside the annulus of the first doped region.

3. The IC claim 2, further comprising a laterally diffused metal oxide semiconductor (LDMOS) transistor on the substrate coupled to the split-gate transistor, wherein the field plate and a gate electrode of the LDMOS transistor comprise polysilicon formed from a same polysilicon layer.

4. The IC of claim 3, wherein the split-gate transistor is part of a start-up circuit or part of an amplifier circuit.

5. The IC of claim 3, further comprising an outer isolation ring doped the second conductivity type around the split-gate transistor, and another outer isolation ring doped the second conductivity type around the LDMOS transistor.

6. The IC of claim 1, wherein the split-gate transistor comprises a junction field effect transistor (JFET), wherein the first doped region comprises a top gate, wherein the second doped region comprises a back gate, wherein the fourth doped region comprises a well region for a drain, wherein the first fifth doped region comprises a source, and wherein the second fifth doped region comprises a drain contact to the fourth doped region.

7. The IC of claim 6, further comprising metal contacts to the top gate, to the back gate, to the source, and to the drain, wherein the top gate and back gate have separate ones of the metal contacts.

8. The IC of claim 1, wherein the first conductivity type comprises n-type and wherein the second conductivity type comprises p-type.

9. The IC of claim 1, wherein the field plate is located on both the field oxide portion and the first doped region.

10. An electronic device, comprising:
    a top gate including a well having a first conductivity type intersecting a top surface of a semiconductor substrate having an opposite second conductivity type;
    a bottom gate including a buried layer having the first conductivity type within the semiconductor substrate;
    a drift region having the second conductivity type between the top gate and the bottom gate;
    a source region and a drain region each having the second conductivity type located within and touching the drift region; and
    a dielectric isolation structure between the well and the drain region.

11. The electronic device of claim 10, further comprising a field plate partially overlying the well and the dielectric isolation structure.

12. The electronic device of claim 11, further comprising a laterally diffused metal oxide semiconductor (LDMOS) transistor formed in or over the semiconductor substrate, wherein the field plate and a gate electrode of the LDMOS transistor comprise polysilicon formed from a same polysilicon layer, and the bottom gate and a reduced surface field layer of the LDMOS transistor are formed by a same doping process.

13. The electronic device of claim 10, wherein the well is formed as an annulus that surrounds the source region.

14. The electronic device of claim 13, wherein the field plate surrounds the well.

15. The electronic device of claim 10, wherein the first conductivity type is p-type and the second conductivity type is n-type.

16. An electronic device, comprising:
    a first terminal connected to a buried first doped region within a semiconductor substrate, the first doped region doped a first conductivity type and the semiconductor substrate doped a second different conductivity type;
    a second terminal connected to a second doped region located between the first doped region and a surface of the substrate, the second doped region doped the second conductivity type;
    a third terminal connected to a third doped region located within the second doped region, the third doped region doped the first conductivity type; and
    a fourth terminal connected to a fourth doped region located within and touching the second doped region, the fourth doped region doped the second conductivity type.

17. The electronic device of claim 16, further comprising a surface isolation structure located between the third doped region and the fourth doped region, and a polysilicon electrode located over the third doped region and the surface isolation structure.

18. The electronic device of claim 16, wherein the third doped region and the polysilicon electrode are both formed as an annulus that surrounds the first doped region.

19. The electronic device of claim 16, wherein the first and the third terminals are configured to modulate a resistance between the second and the fourth terminals through the second doped region.

20. The electronic device of claim 16, wherein the first conductivity type is p-type and the second conductivity type is n-type.

* * * * *